United States Patent
Choi

(10) Patent No.: US 10,911,002 B2
(45) Date of Patent: Feb. 2, 2021

(54) MULTISTAGE POWER AMPLIFIER WITH BIAS COMPENSATING FUNCTION

(71) Applicant: Samsung Electro-Mechanics Co., Ltd., Suwon-si (KR)

(72) Inventor: Kyu Jin Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 50 days.

(21) Appl. No.: 16/373,830

(22) Filed: Apr. 3, 2019

(65) Prior Publication Data

US 2020/0014336 A1    Jan. 9, 2020

(30) Foreign Application Priority Data

Jul. 5, 2018 (KR) .................. 10-2018-0078187

(51) Int. Cl.
| | |
|---|---|
| *H03G 3/20* | (2006.01) |
| *H03F 1/02* | (2006.01) |
| *H03F 1/32* | (2006.01) |
| *H03F 3/21* | (2006.01) |
| *H03G 3/30* | (2006.01) |

(Continued)

(52) U.S. Cl.
CPC ............ *H03F 1/0266* (2013.01); *H02M 7/04* (2013.01); *H03F 1/3223* (2013.01); *H03F 3/189* (2013.01); *H03F 3/211* (2013.01); *H03G 3/3042* (2013.01); *H03F 1/0222* (2013.01); *H03F 3/19* (2013.01); *H03F 2200/102* (2013.01)

(58) Field of Classification Search
CPC ...... H03F 1/0266; H03F 1/3223; H03F 3/211; H03F 3/189; H03F 2200/102; H03F 3/20; H03F 3/68; H03G 3/3042; H02M 7/04

USPC .......................................... 330/277, 296, 51
See application file for complete search history.

(56) References Cited

U.S. PATENT DOCUMENTS

2003/0214359 A1    11/2003   Sasho et al.
2017/0163216 A1*   6/2017    Li ............................. H03F 3/19

FOREIGN PATENT DOCUMENTS

| KR | 2003-0090518 A | 11/2003 |
|---|---|---|
| KR | 10-2004-0102298 A | 12/2004 |

OTHER PUBLICATIONS

Zeji Gu. et al., "Enhanced linearity and efficiency of HBT MMIC power Aplifiers for WCDMA Applications", Proceedings of the 40th European Microwave Conference, Sep. 2010, pp. 1002-1005 (4 pages in English).

* cited by examiner

*Primary Examiner* — Khanh V Nguyen
*Assistant Examiner* — Khiem D Nguyen
(74) *Attorney, Agent, or Firm* — NSIP Law

(57) ABSTRACT

A multistage power amplifier includes a first amplification circuit disposed in a front stage of the multistage power amplifier, a first bias circuit configured to output a first bias current, a bias path circuit, an envelope detection circuit, and an alternating current (AC) path circuit. The envelope detection circuit is configured to output a direct current (DC) detection voltage based on an envelope signal of a radio frequency (RF) signal input to the first amplification circuit. The AC path circuit is configured to branch an AC signal from an input terminal of the first amplification circuit and transfer the AC signal to the first bias circuit, upon the first amplification circuit operating in a high power driving region based on the DC detection voltage. The first bias circuit is configured to compensate for the first bias current based on the AC signal transferred through the AC path circuit.

20 Claims, 7 Drawing Sheets

(51) Int. Cl.
*H02M 7/04* (2006.01)
*H03F 3/189* (2006.01)
*H03F 3/19* (2006.01)

MULTISTAGE POWER AMPLIFIER WITH BIAS COMPENSATING FUNCTION

CROSS-REFERENCE TO RELATED APPLICATION(S)

This application claims the benefit under 35 U.S.C. § 119(a) of Korean Patent Application No. 10-2018-0078187 filed on Jul. 5, 2018 in the Korean Intellectual Property Office, the entire disclosure of which is incorporated herein by reference for all purposes.

BACKGROUND

1. Field

The present disclosure relates to a multistage power amplifier having a bias compensating function.

2. Description of Related Art

In general, a multistage power amplifier includes a first amplifier and a second amplifier that may be connected to each other in series, each have amplification gain, and amplify input signals using a generally high amplification gain.

The first amplifier may be configured to amplify an input signal and output the amplified signal to the second amplifier. The second amplifier may be configured to amplify a signal input from the first amplifier. The first amplifier and the second amplifier may share a total amplification gain, and the first amplifier may be configured to perform an amplification and buffer function.

In this example, the first amplifier may be a drive amplifier (DA) and the second amplifier may be a power amplifier.

A conventional multistage power amplifier has a disadvantage in that a base bias of the first amplifier droops in a high power driving region, which affects the linearity of the amplifier.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multistage power amplifier includes a first amplification circuit disposed in a front stage of the multistage power amplifier, a first bias circuit configured to output a first bias current, a bias path circuit, an envelope detection circuit, and an alternating current (AC) path circuit. The bias path circuit is configured to transfer the first bias current to the first amplification circuit. The envelope detection circuit is configured to output a direct current (DC) detection voltage based on an envelope signal of a radio frequency (RF) signal input to the first amplification circuit. The alternating current (AC) path circuit is configured to branch an AC signal from an input terminal of the first amplification circuit and transfer the AC signal to the first bias circuit, upon the first amplification circuit operating in a high power driving region based on the DC detection voltage. The first bias circuit is configured to compensate for the first bias current based on the AC signal transferred through the AC path circuit.

The first bias circuit may include a first bias transistor configured to compensate for the first bias current based on the AC signal.

The envelope detection circuit may be further configured to rectify the envelope signal to output the DC detection voltage.

The envelope detection circuit may include an extraction circuit configured to extract the envelope signal of the RF signal; a rectifying circuit configured to rectify the envelope signal and output the DC detection voltage; and a filter circuit configured to remove an AC component from the DC detection voltage.

The envelope detection circuit may be configured to receive a control voltage from an external source through an input terminal of the rectifying circuit.

The AC path circuit may be connected to the bias path circuit in parallel.

The AC path circuit may include a first switch circuit configured to switch on or off in response to the DC detection voltage; and a first capacitor circuit connected in series to the first switch circuit to transfer the AC signal branched from the input terminal of the first amplification circuit.

In another general aspect, a multistage power amplifier includes a first amplification circuit, a second amplification circuit, a first bias circuit, a second bias circuit, a bias path circuit, an envelope detection circuit, and an alternating current (AC) path circuit. The second amplification circuit is connected to the first amplification circuit. The first bias circuit is configured to output a first bias current to the first amplification circuit. The second bias circuit is configured to output a second bias current to the second amplification circuit. The bias path circuit is connected between the first bias circuit and the first amplification circuit to transfer the first bias current to the first amplification circuit. The envelope detection circuit is configured to output a direct current (DC) detection voltage based on an envelope signal of a radio frequency (RF) signal input to the first amplification circuit. The alternating current (AC) path circuit is connected to the bias path circuit in parallel, and connected between an input terminal of the first amplification circuit and the first bias circuit to transfer an AC signal to the first bias circuit in order to compensate for the first bias current upon the DC detection voltage being greater than a reference voltage.

The first bias circuit may be further configured to compensate for the first bias current based on the AC signal transferred through the AC path circuit.

The first bias circuit may include a first bias transistor compensating for the first bias current based on the AC signal.

The envelope detection circuit may be further configured to rectify the envelope signal to output the DC detection voltage.

The envelope detection circuit may include an extraction circuit configured to extract the envelope signal of the RF signal, a rectifying circuit configured to rectify the envelope signal and output the DC detection voltage, and a filter circuit configured to remove an AC component from the DC detection voltage.

The envelope detection circuit may be configured to receive a control voltage from an external source through an input terminal of the rectifying circuit.

The AC path circuit may include a first switch circuit configured to switch on or off in response to the DC detection voltage, and a first capacitor circuit connected to the first switch circuit in series to transfer the AC signal branched from the input terminal from the first amplification circuit.

In another general aspect, a multistage power amplifier includes a first amplification circuit, an alternating current (AC) path circuit, and an envelope detection circuit. The first amplification circuit is connected in series to a second amplification circuit. The AC path circuit is connected in parallel to a bias path circuit, between the first amplification circuit and a first bias circuit. The envelope detection circuit is connected between a radio frequency (RF) signal input to the first amplification circuit and the AC path circuit. The first bias circuit is configured to output a first bias current to the first amplification circuit through the bias path circuit, and the AC path circuit is configured to output an AC signal from an input terminal of the first amplification circuit to the first bias circuit.

A second bias circuit may be connected to an input of the second amplification circuit to output a second bias current to the second amplification circuit.

The first bias circuit may include a first bias transistor configured to compensate for the first bias current based on the AC signal.

The envelope detection circuit may be configured to output a direct current (DC) detection voltage based on an envelope signal of the RF signal.

The envelope detection circuit may be further configured to rectify the envelope signal.

The envelope detection circuit may include an extraction circuit configured to extract the envelope signal of the RF signal, a rectifying circuit configured to rectify the envelope signal and output the DC detection voltage, and a filter circuit configured to remove an AC component from the DC detection voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
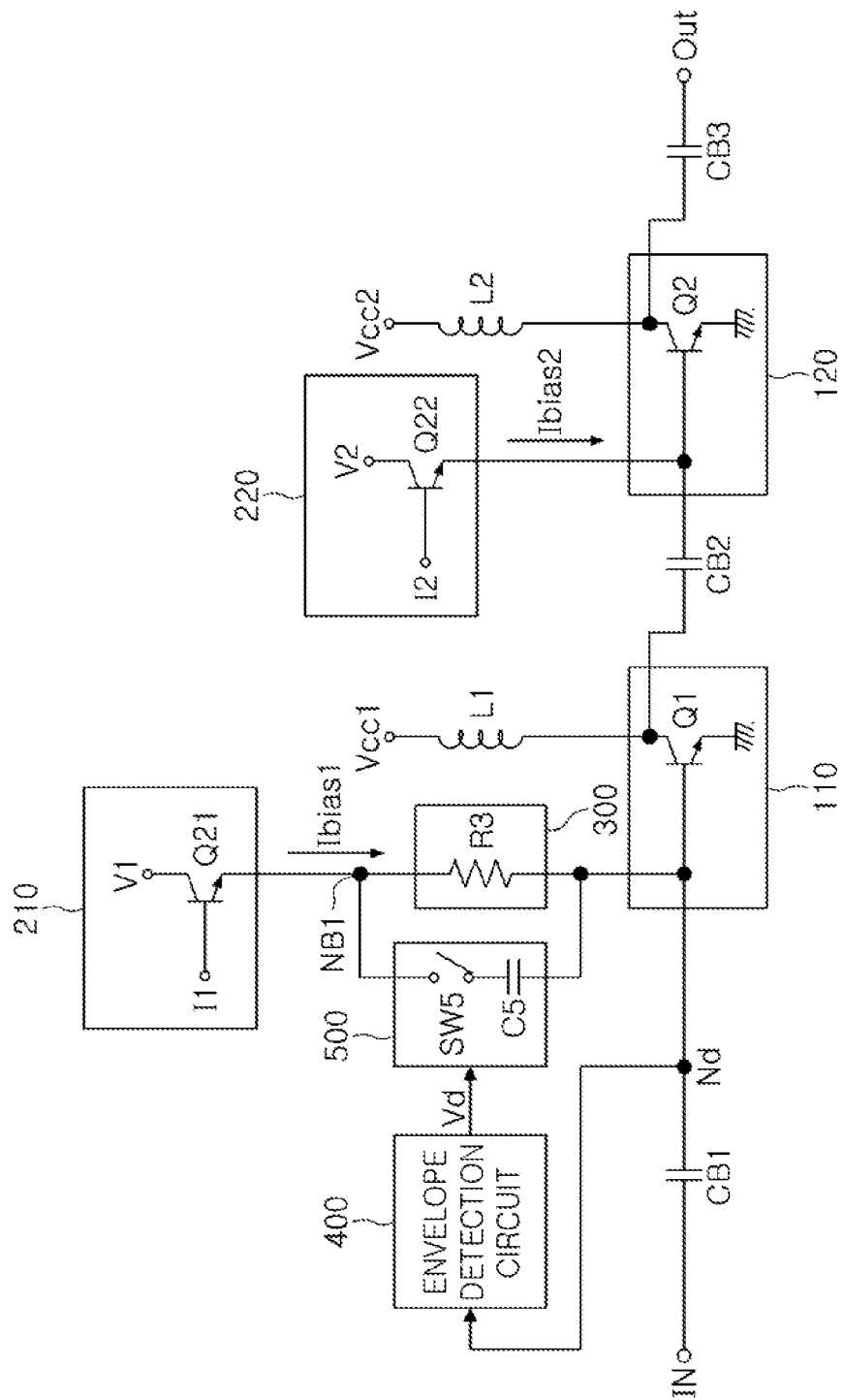
FIG. 1 is a diagram illustrating an example of a multistage power amplifier.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an example of a multistage power amplifier.

Referring to FIG. 1, a multistage power amplifier may include a first amplification circuit 110, a second amplification circuit 120, a first bias circuit 210, a second bias circuit 220, a bias path circuit 300, an envelope detection circuit 400, and an alternating current (AC) path circuit 500.

When bias compensation is not performed for each of the first amplification circuit 110 and the second amplification circuit 120 in the present disclosure, bias points for power transistors included in the first amplification circuit 110 and the second amplification circuit 120, respectively, for small and large signals may be different from each other. The difference may be due to the magnitude of the signal input swing into the power transistor that causes a difference in a nonlinear operation of the bias circuit.

In general, as input power is increased, the bias point increases while the magnitude of the additional DC component generated by a secondary nonlinear characteristic of the bias circuit also increases. On the contrary, in an example in which the input power is low, since the magnitude of the additional DC component induced by the nonlinearity of the bias circuit is relatively small, the bias point of the power transistor droops. In particular, in a multi stage amplifier, an AM-AM distortion may be determined based on a variance of an amplitude of the bias point of an input signal of each stage, which is directly related to the linearity of the amplifier. Therefore, based on the present disclosure, the attendant droop due to the non-linearity of a bias circuit or current may be adequately compensated.

Figure 2:
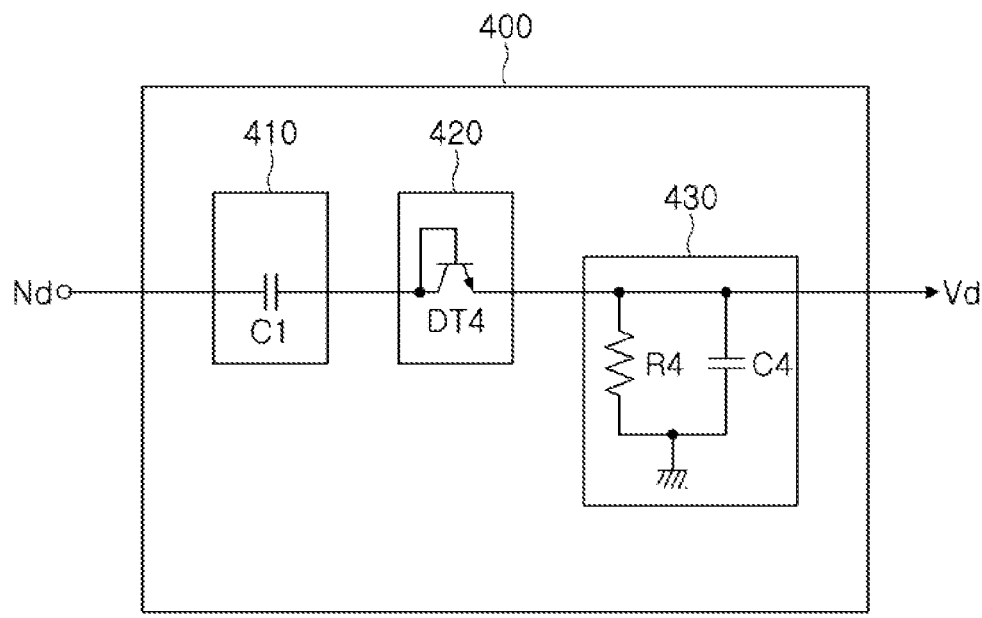
FIG. 2 is a diagram illustrating an example of an envelope detection circuit.

Referring to FIGS. 1 and 2, the first amplification circuit 110 may be driven with relatively small input power than the second amplification circuit 120. When the bias compensation according to the present disclosure is not applied, the bias point of the first amplification circuit may droop as the amplitude of the input signal is larger.

When the bias compensation according to the present disclosure is applied, the bias point of the first amplification circuit 110 drooping in a high power driving region may be mitigated by compensating for a first bias current using a radio frequency (RF) signal branched from an input radio frequency signal. The bias compensation will hereinafter be described.

The first bias circuit 210 may be supplied with a first voltage V1 to generate a first bias current Ibias1, based on a first current I1, as an output to the first amplification circuit 110. As an example, the first bias circuit 210 may include a first bias transistor Q21 that is configured to generate the first bias current Ibias1 based on the first current I1.

The second bias circuit 220 may be supplied with a second voltage V2 to generate a second bias current Ibias2, based on a second current I2, as an output to the second amplification circuit 120. As an example, the second bias circuit 220 may include a second bias transistor Q22 that is configured to generate the second bias current Ibias2 based on the second current I2.

The first amplification circuit 110 may be provided with the first bias current Ibias1 and configured to amplify the input radio frequency signal as an amplified radio frequency signal to the second amplification circuit 120. As an example, the first amplification circuit 110 may include a first amplification transistor Q1 having a collector connected to an operation power supply Vcc1 through a coil L1, a grounded emitter, and a base input with a radio frequency signal.

The second amplification circuit 120 may be supplied with the second bias current Ibias2 and configured to amplify the radio frequency signal input from the first amplification circuit 110. As an example, the second amplification circuit 120 may include a second amplification transistor Q2 having a collector connected to an operation power supply Vcc2 through a coil L2, a grounded emitter, and a base input with a radio frequency signal.

The bias path circuit 300 may transfer the first bias current Ibias1 to the first amplification circuit 110. As an example, the bias path circuit 300 may include a direct current (DC) path (PH-DC) connected between the first bias circuit 210 and the first amplification circuit 110. As an example, the DC path (PH-DC) may include a resistor R3. The first bias current Ibias1 may be transferred to the first amplification circuit 110 through the DC path (PH-DC).

The envelope detection circuit 400 may detect an envelope signal from the RF signal input to the first amplification circuit 110, and output a DC detection voltage Vd based on the envelope signal. As an example, the envelope detection circuit 400 may include a rectifying circuit.

The AC path circuit 500 may transfer an AC signal branched from an input terminal of the first amplification circuit 110 to the first bias circuit 210 when the first amplification circuit is operating in a high power driving region based on the DC detection voltage Vd. As an example, the AC path circuit 500 may be connected to the bias path circuit in parallel 300. As an example, the AC path circuit 500 may include an AC path (PH-AC) connected in parallel to the DC path (PH-DC). As an example, the AC path (PH-AC) may include a switch SW4 and a capacitor C5.

When the DC detection voltage Vd is greater than a reference voltage, the AC path circuit 500 may transfer the AC signal branched from the input terminal of the first amplification circuit 110 to the first bias circuit 210 in order to compensate for the first bias current Ibias1.

The first bias circuit 210 may compensate for the first bias current Ibias1 based on the AC signal transferred through the AC path circuit 500. As an example, the first bias circuit 210 may include a first bias transistor Q21 that outputs the first bias current Ibias1. The first bias transistor Q21 may compensate for the first bias current Ibias1 to rise by using a direct current generated based on the AC signal input to the emitter.

The envelope detection circuit 400 may detect an envelope signal from the RF signal input to the first amplification circuit 110 and rectify the envelope signal to output the DC detection voltage Vd. The envelope detection circuit will be described with reference to FIGS. 2 and 3.

In FIG. 1, CB1, CB2, and CB3 may be DC blocking capacitors that block the DC signal (voltage or current) and pass the AC signal.

In the respective drawings in the present disclosure, an unnecessary overlapping description for components denoted by the same reference numerals and having the same functions will be omitted, and contents different from each other will be described in the respective drawings.

Figure 3:
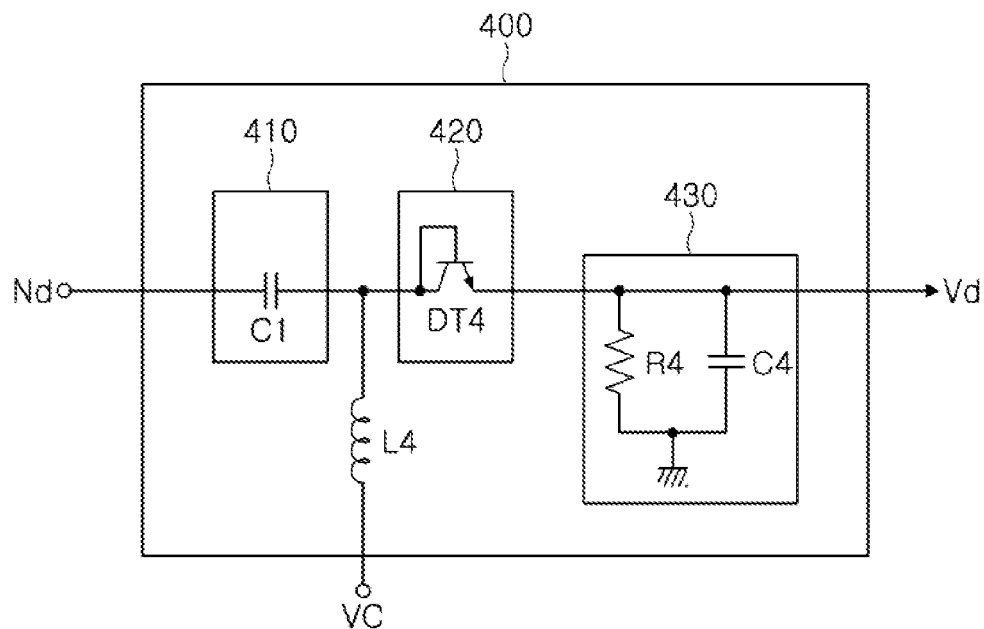
FIG. 3 is a diagram illustrating an example of an envelope detection circuit.

FIGS. 2 and 3 are diagrams illustrating examples of an envelope detection circuit in the present disclosure.

Referring to FIGS. 2 and 3, the envelope detection circuit 400 may each include an extraction circuit 410, a rectifying circuit 420, and a filter circuit 430.

The extraction circuit 410 may extract an envelope signal of the RF signal. As an example, the extraction circuit 410 may include a capacitor C1 that passes the AC signal.

The rectifying circuit 420 may rectify the envelope signal and output the DC detection voltage Vd. As an example, the rectifying circuit 420 may include a rectifying element DT4, and the rectifying element DT4 may include an element having a rectifying function such as a diode-connected transistor or the like.

The filter circuit 430 may remove an AC component from the DC detection voltage Vd to stabilize the DC detection voltage Vd. As an example, the filter circuit 430 may include a capacitor C4 connected between an output terminal of the rectifying circuit 420 and a ground, and a resistor R4 connected in parallel to the capacitor C4.

Referring to FIG. 3, the envelope detection circuit 400 may receive a control voltage VC from an external source through an inductor L4 from the input terminal of the rectifying circuit 420.

Figure 4:
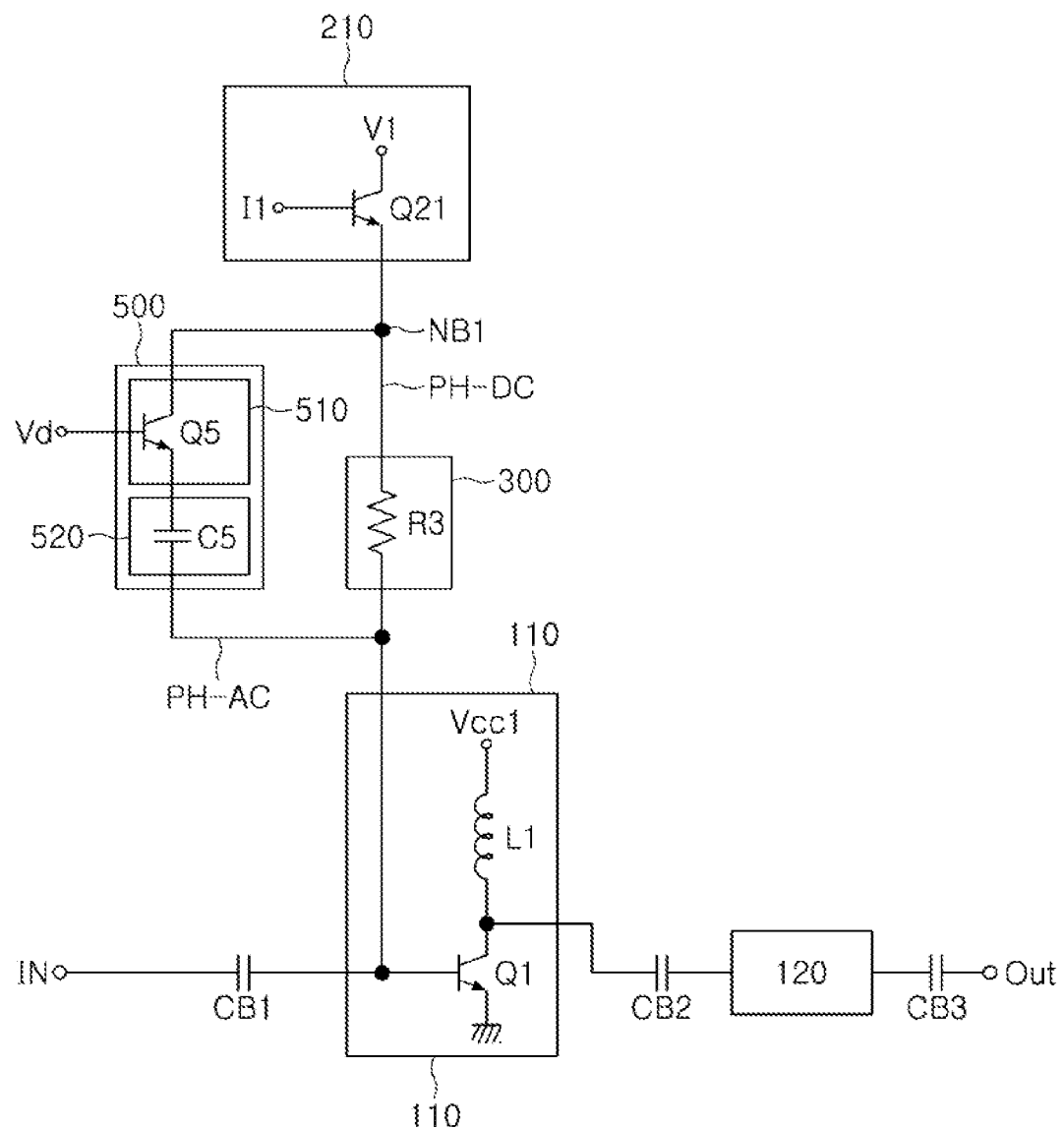
FIG. 4 is a diagram illustrating an example of an alternating current (AC) path circuit and a bias path circuit.

FIG. 4 is a diagram illustrating an example of an alternating current (AC) path circuit and a bias path circuit in the present disclosure.

Referring to FIG. 4, the AC path circuit 500 may include a first switch circuit 510 and a first capacitor circuit 520.

The first switch circuit 510 may be included in the AC path (PH-AC) and may be switched on or off in response to the DC detection voltage Vd. As an example, the first switch circuit 510 may include a switch transistor Q5.

The first capacitor circuit 520 may be included in the AC path (PH-AC) and be connected in series with the first switch circuit 510 to transfer the AC signal branched from the input terminal of the first amplification circuit 110. As an example, the first capacitor circuit 520 may include a capacitor C5.

For example, the switch transistor Q5 may switched on or off in response to the DC detection voltage Vd. As an example, when the DC detection voltage Vd is at a low level, the switch transistor Q5 may be in a turned-off state, and when the DC detection voltage Vd is at a high level, the switch transistor Q5 may be in a turned-on state.

Referring to FIGS. 3 and 4, when voltage magnitude of the control voltage VC is adjusted, a turn-on of the switch transistor Q5 included in the AC path circuit 500 may be controlled.

In detail, in order to adjust a range of the DC detection voltage Vd provided from an output terminal of the envelope detection circuit 400, the control voltage VC may be supplied to an anode terminal of the rectifying element DT4. The magnitude of an input voltage capable of turning on the switch transistor Q5 may be changed depending on the magnitude of the control voltage VC.

As an example, when a high control voltage VC is applied, the rectifying element DT4 and the switch transistor Q5 may be turned on even at a relatively small input power. Contrarily, in an example in which a low control voltage VC is applied, since a base-emitter junction of the switch transistor Q5 may be turned off even when the rectifying element DT4 is turned on, the switch transistor Q5 may not be driven.

For example, in a case in which the emitter of the switch transistor Q5 has a voltage of 1.2V, in order for the switch transistor Q5 to be turned on, a base voltage of about 2.4V or more which is greater than the turn-on voltage (e.g., 1.2V), rather than the emitter voltage of 1.2V, needs to be applied.

Therefore, in order for the base voltage of the switch transistor Q5 to be 2.4 V or more, considering the turn-on voltage of the rectifying element DT4 of 1.2V and the swing of the signal additionally input through the capacitor C1, an approximate control voltage VC needs to be about 3.1V to 3.4V.

As an example, when the switch transistor Q5 is in the on state, the first capacitor circuit 520 may branch the AC signal from the RF signal input to the first amplification circuit 110, and transfer the branched AC signal to the first bias circuit 210.

Figure 5:
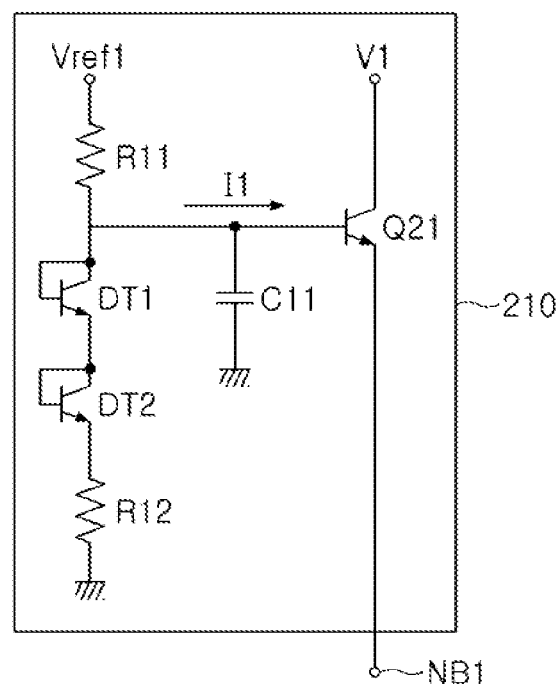
FIG. 5 is a diagram illustrating an example of a first bias circuit.

FIG. 5 is a diagram illustrating an example of a first bias circuit in the present disclosure.

Referring to FIG. 5, the first bias circuit 210 may include a first resistor R11, first and second diode-connected transistors DT1 and DT2, a second resistor R12, a capacitor C11, and the bias transistor Q21.

The first resistor R11, the first and second diode-connected transistors DT1 and DT2, and the second resistor R12 may be connected to each other in series between a reference voltage Vref1 terminal and a ground. The first bias transistor Q21 may be connected in series between a first voltage V1 terminal and a bias node NB1 connected to the first amplification circuit 120. The capacitor C11 may be connected between a base of the first bias transistor Q21 and a ground.

Referring to FIG. 5, the first bias current Ibias1 of transistor Q21 may be transferred with the AC signal through the emitter.

Figure 6:
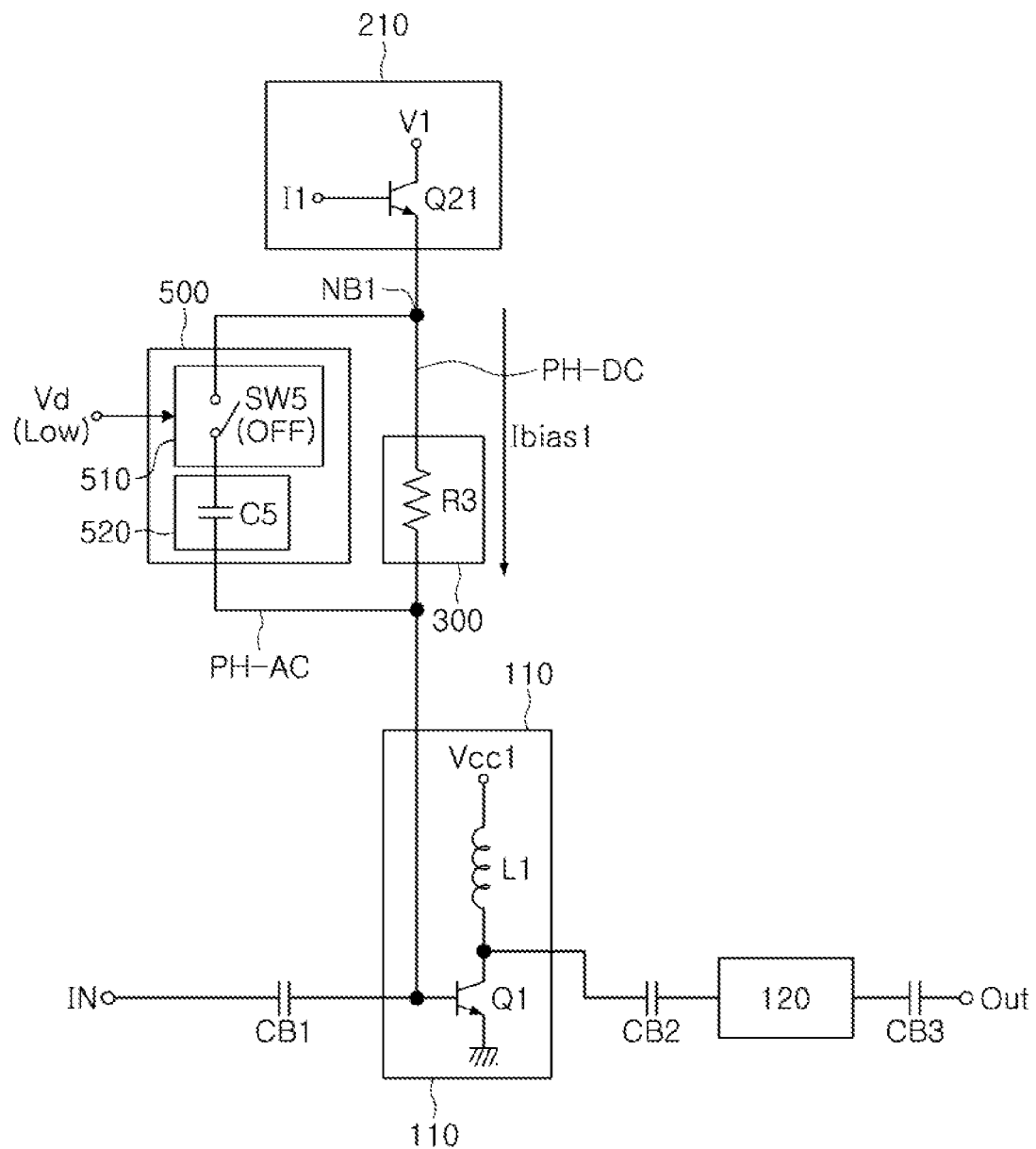
FIG. 6 is a diagram for describing an off-operation of the AC path circuit of FIG. 4.

FIG. 6 is a diagram for describing an off-operation of the AC path circuit of FIG. 4.

Referring to FIGS. 4 and 6, the DC detection voltage Vd may be designed to be lower than the turn-on voltage in a lower power region, and when the DC detection voltage Vd is lower than the turn-on voltage, the switch transistor Q5 of the AC path circuit 500 may be in a turned-off state. Accordingly, the first bias current Ibias1 may be transferred to the first amplification circuit 110 through the bias path circuit 300.

Figure 7:
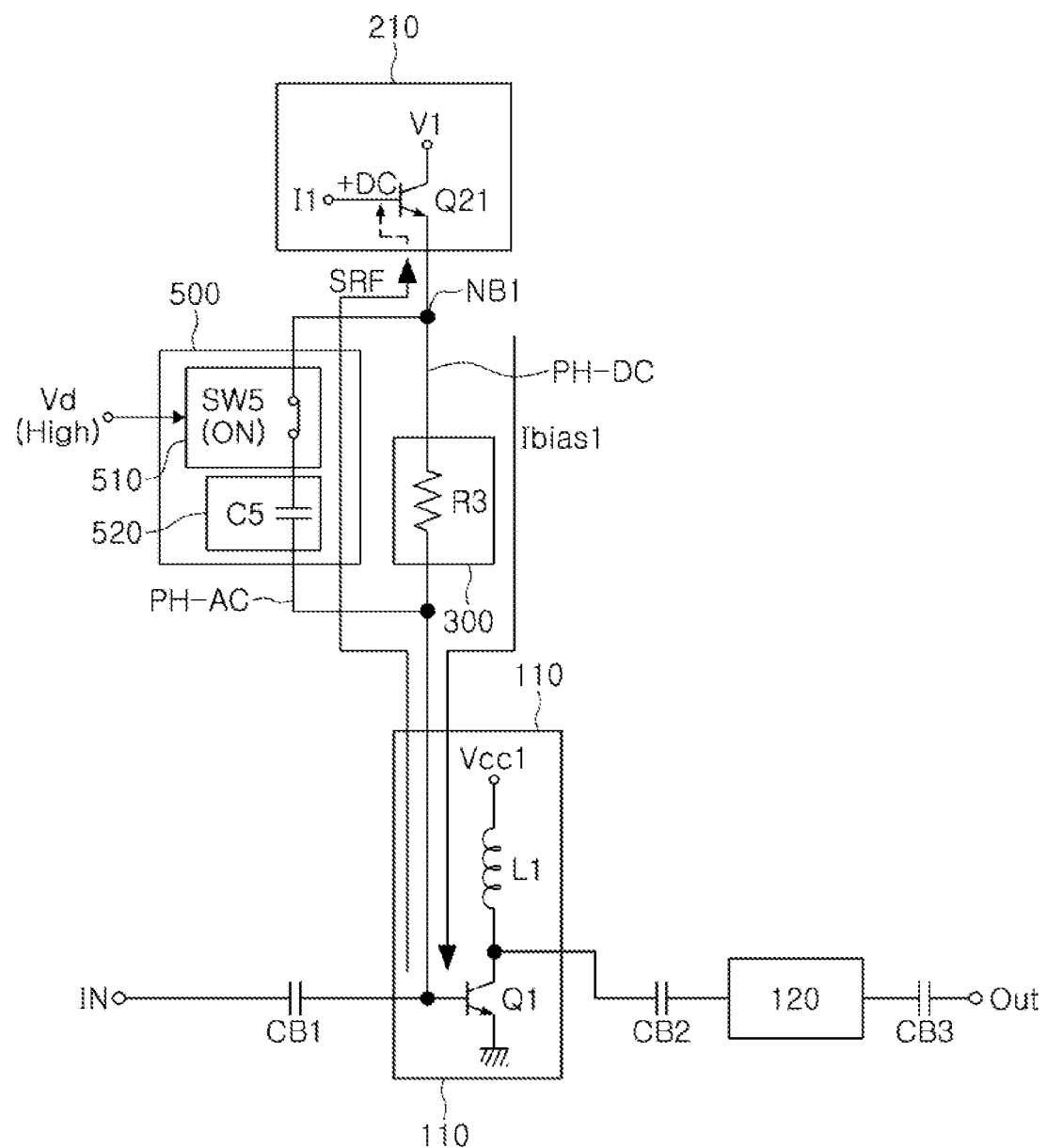
FIG. 7 is a diagram for describing an on-operation of the AC path circuit of FIG. 4.

FIG. 7 is a diagram for describing an on-operation of the AC path circuit of FIG. 4.

Referring to FIGS. 4 and 7, the DC detection voltage Vd may be designed to be higher than the turn-on voltage in a high-power driving region, and when the DC detection voltage Vd is higher than the turn-on voltage, the switch transistor Q5 of the AC path circuit 500 may be in the turned-on state. Accordingly, when the switch transistor Q5 is turned on, the first capacitor circuit 520 may branch an AC signal SRF from the RF signal input to the first amplification circuit 110 and the branched AC signal may be transferred to the emitter of the first bias transistor Q21 of the first bias circuit 210.

Here, due to secondary nonlinear characteristics of the first bias transistor Q21, a direct current may be generated in the base of the first bias transistor Q21 based on the AC signal transferred through the AC path circuit 500, and the first bias transistor Q21 may compensate for the first bias current Ibias1 to raise by the direct current.

The first bias current Ibias1 compensated as described above may be transferred to the first amplification circuit 110 through the bias path circuit 300.

Figure 8:
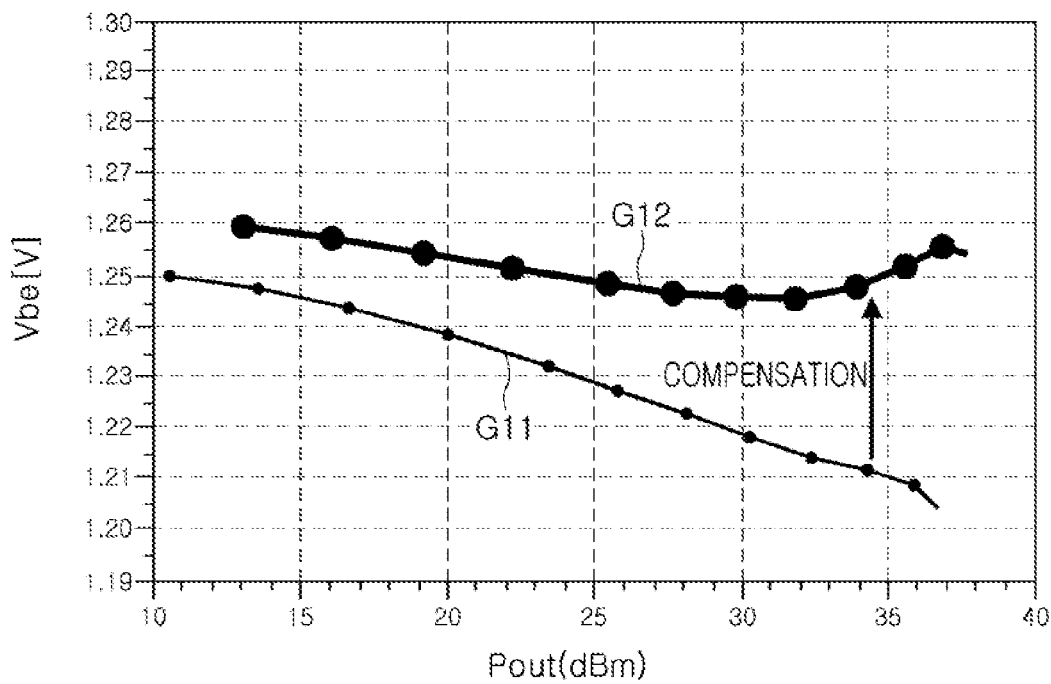
FIG. 8 is a graph of Vbe-output power of a first amplification circuit.

FIG. 8 is a graph of Vbe-output power of an example of a first amplification circuit in the present disclosure.

The graph of FIG. 8 is a graph depicting an example of a result obtained by simulating a base-emitter voltage Vbe of the first amplification circuit 110 and output power while increasing input power.

G11 of FIG. 8 is a Vbe-output power graph of the first amplification circuit for a case to which a bias compensation using the AC path circuit 500 is not applied, and G12 is a Vbe-output power graph of the first amplification circuit for a case to which the AC path circuit 500 is applied.

Referring to G11 and G12 of FIG. 8, a droop phenomenon of a base-emitter voltage Vbe of the first amplification circuit 110 depicted in G11 is improved when compared to G12 which uses the bias compensation that includes the AC path circuit 500. The base-emitter voltage Vbe of G12 rises again from an output voltage of about 30 dBm to further improve the voltage droop phenomenon depicted in G11.

Figure 9:
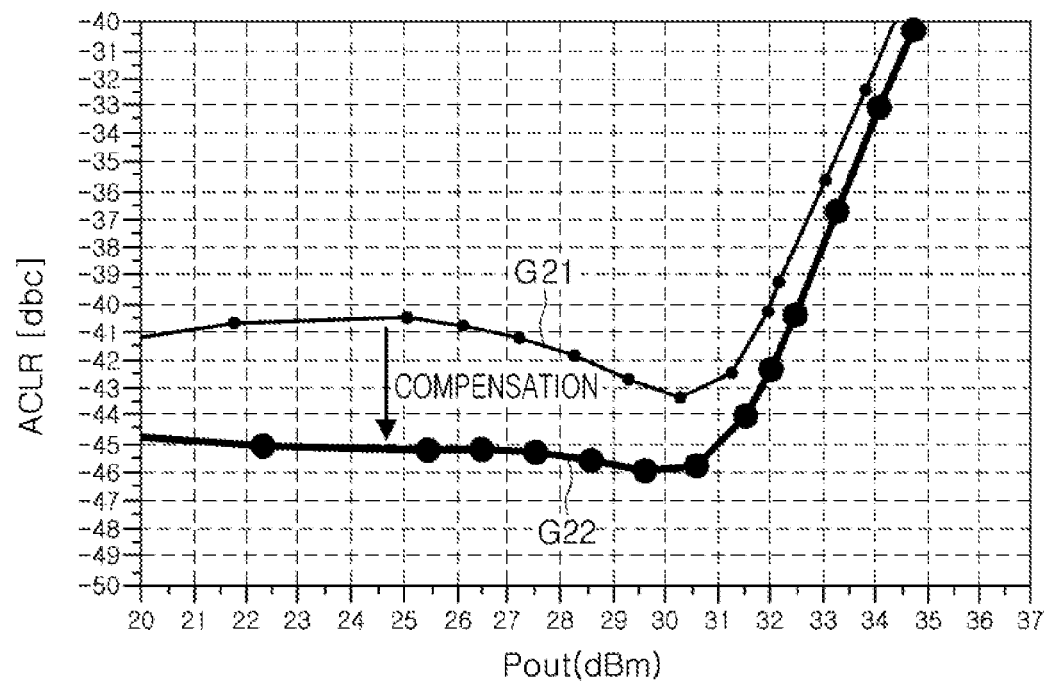
FIG. 9 is a graph of ACLR-output power.

FIG. 9 is a graph of ACLR—output power in the present disclosure.

The graph of FIG. 9 is a graph of a result obtained by simulating an adjacent channel leakage ratio (ACLR) while increasing input power.

G21 of FIG. 9 is an ACLR graph for a case to which a bias compensation using the AC path circuit 500 is not applied, and G22 is an ACLR graph for a case to which the bias compensation using the AC path circuit 500 is applied.

Referring to G21 and G22 of FIG. 9, the first amplification circuit 110 shows the shape of droop in G21 and the rising of each of the AM-AM distortion curves due to a difference in swing size of the input signal. In an example depicted in G22 in which the bias compensation that includes the AC path circuit 500 is applied, a change in the overall region of the AM-AM distortion curve is mitigated against to thereby improve the ACLR, which is a linearity index.

As set forth above, according to the exemplary embodiment in the present disclosure, by compensating for the first bias current using the DC voltage based on the envelope component of the RF signal in the high power driving region, linearity of the first bias may be improved and the amplitude distortion (e.g., AM-AM distortion) of the multistage power amplifier may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multistage power amplifier, comprising:
   a first amplification circuit disposed in a front stage of the multistage power amplifier;
   a first bias circuit configured to output a first bias current;
   a bias path circuit configured to transfer the first bias current to the first amplification circuit;
   an envelope detection circuit configured to output a direct current (DC) detection voltage based on an envelope signal of a radio frequency (RF) signal input to the first amplification circuit; and
   an alternating current (AC) path circuit configured to branch an AC signal from an input terminal of the first amplification circuit and transfer the AC signal to the first bias circuit, upon the first amplification circuit operating in a high power driving region based on the DC detection voltage,
   wherein the first bias circuit is configured to compensate for the first bias current based on the AC signal transferred through the AC path circuit.

2. The multistage power amplifier of claim 1, wherein the first bias circuit comprises a first bias transistor configured to compensate for the first bias current based on the AC signal.

3. The multistage power amplifier of claim 2, wherein the envelope detection circuit is further configured to rectify the envelope signal to output the DC detection voltage.

4. The multistage power amplifier of claim 2, wherein the envelope detection circuit comprises:
   an extraction circuit configured to extract the envelope signal of the RF signal;
   a rectifying circuit configured to rectify the envelope signal and output the DC detection voltage; and
   a filter circuit configured to remove an AC component from the DC detection voltage.

5. The multistage power amplifier of claim 4, wherein the envelope detection circuit is configured to receive a control voltage from an external source through an input terminal of the rectifying circuit.

6. The multistage power amplifier of claim 1, wherein the AC path circuit is connected to the bias path circuit in parallel.

7. The multistage power amplifier of claim 6, wherein the AC path circuit comprises:
   a first switch circuit configured to switch on or off in response to the DC detection voltage; and
   a first capacitor circuit connected in series to the first switch circuit to transfer the AC signal branched from the input terminal of the first amplification circuit.

8. A multistage power amplifier, comprising:
   a first amplification circuit;
   a second amplification circuit connected to the first amplification circuit;
   a first bias circuit configured to output a first bias current to the first amplification circuit;
   a second bias circuit configured to output a second bias current to the second amplification circuit;
   a bias path circuit connected between the first bias circuit and the first amplification circuit to transfer the first bias current to the first amplification circuit;
   an envelope detection circuit configured to output a direct current (DC) detection voltage based on an envelope signal of a radio frequency (RF) signal input to the first amplification circuit; and
   an alternating current (AC) path circuit connected to the bias path circuit in parallel, and connected between an input terminal of the first amplification circuit and the first bias circuit to transfer an AC signal to the first bias circuit in order to compensate for the first bias current upon the DC detection voltage being greater than a reference voltage.

9. The multistage power amplifier of claim 8, wherein the first bias circuit is further configured to compensate for the first bias current based on the AC signal transferred through the AC path circuit.

10. The multistage power amplifier of claim 9, wherein the first bias circuit comprises a first bias transistor compensating for the first bias current based on the AC signal.

11. The multistage power amplifier of claim 10, wherein the envelope detection circuit is further configured to rectify the envelope signal to output the DC detection voltage.

12. The multistage power amplifier of claim 11, wherein the envelope detection circuit comprises:
   an extraction circuit configured to extract the envelope signal of the RF signal;
   a rectifying circuit configured to rectify the envelope signal and output the DC detection voltage; and
   a filter circuit configured to remove an AC component from the DC detection voltage.

13. The multistage power amplifier of claim 12, wherein the envelope detection circuit is configured to receive a control voltage from an external source through an input terminal of the rectifying circuit.

14. The multistage power amplifier of claim 13, wherein the AC path circuit comprises:
   a first switch circuit configured to switch on or off in response to the DC detection voltage; and
   a first capacitor circuit connected to the first switch circuit in series to transfer the AC signal branched from the input terminal from the first amplification circuit.

15. A multistage power amplifier, comprising:
   a first amplification circuit connected in series to a second amplification circuit;
   an alternating current (AC) path circuit connected in parallel to a bias path circuit, between the first amplification circuit and a first bias circuit; and
   an envelope detection circuit connected between a radio frequency (RF) signal input to the first amplification circuit and the AC path circuit,
   wherein the first bias circuit is configured to output a first bias current to the first amplification circuit through the bias path circuit, and the AC path circuit is configured to output an AC signal from an input terminal of the first amplification circuit to the first bias circuit.

16. The multistage power amplifier of claim 15, wherein a second bias circuit is connected to an input of the second amplification circuit to output a second bias current to the second amplification circuit.

17. The multistage power amplifier of claim 15, wherein the first bias circuit comprises a first bias transistor configured to compensate for the first bias current based on the AC signal.

18. The multistage power amplifier of claim 15, wherein the envelope detection circuit is configured to output a direct current (DC) detection voltage based on an envelope signal of the RF signal.

19. The multistage power amplifier of claim 18, wherein the envelope detection circuit is further configured to rectify the envelope signal.

20. The multistage power amplifier of claim 18, wherein the envelope detection circuit comprises:
   an extraction circuit configured to extract the envelope signal of the RF signal;
   a rectifying circuit configured to rectify the envelope signal and output the DC detection voltage; and
   a filter circuit configured to remove an AC component from the DC detection voltage.

* * * * *